(12) United States Patent
Mirichigni et al.

(10) Patent No.: US 7,196,943 B2
(45) Date of Patent: Mar. 27, 2007

(54) MEMORY DEVICE

(75) Inventors: Graziano Mirichigni, Pietracamela (IT); Andrea Martinelli, Gazzaniga (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 11/249,763

(22) Filed: Oct. 13, 2005

(65) Prior Publication Data

US 2006/0083077 A1 Apr. 20, 2006

(30) Foreign Application Priority Data

Oct. 15, 2004 (EP) .................................. 04105094

(51) Int. Cl.
*G11C 7/10* (2006.01)
(52) U.S. Cl. ..................... 365/189.06; 365/185.18; 365/185.25; 365/230.06
(58) Field of Classification Search ........... 365/189.96, 365/185.18, 185.25, 230.06
See application file for complete search history.

(56) References Cited

U.S. PATENT DOCUMENTS

| | | | | |
|---|---|---|---|---|
| 4,999,813 A | * | 3/1991 | Ohtsuka et al. | 365/185.18 |
| 5,463,583 A | * | 10/1995 | Takashina | 365/189.06 |
| 5,814,853 A | | 9/1998 | Chen | 257/315 |
| 6,175,523 B1 | | 1/2001 | Yang et al. | 365/185.25 |
| 6,240,020 B1 | | 5/2001 | Yang et al. | 365/185.25 |
| 6,414,875 B2 | | 7/2002 | Rolandi | 365/185.17 |
| 6,717,839 B1 | | 4/2004 | Du | 365/145 |
| 6,751,126 B2 | * | 6/2004 | Kim | 365/185.18 |
| 2002/0036914 A1 | | 3/2002 | Hayashi | 365/104 |
| 2003/0026145 A1 | | 2/2003 | Lee | 365/200 |
| 2003/0043628 A1 | | 3/2003 | Lee | 365/185.17 |
| 2003/0161183 A1 | | 8/2003 | Tran | 365/185.03 |
| 2003/0210581 A1 | | 11/2003 | Lee et al. | 365/200 |
| 2003/0227811 A1 | | 12/2003 | Sugiura et al. | 365/222 |
| 2004/0085831 A1 | | 5/2004 | Cho et al. | 365/200 |

* cited by examiner

*Primary Examiner*—Richard T. Elms
*Assistant Examiner*—Toan Le
(74) *Attorney, Agent, or Firm*—Lisa K. Jorgenson; Robert Iannucci; Seed IP Law Group PLLC

(57) ABSTRACT

A semiconductor memory device includes a plurality of memory cells arranged according to a plurality of rows and a plurality of columns. The memory devices further includes a plurality of bit lines, each bit line being associated with a respective column of the plurality, and a selecting structure of the bit lines, to select at least one among the bit lines, keeping the remaining bit lines unselected. The memory device further includes a voltage clamping circuit structured to cause the clamping at a prescribed voltage of the unselected bit lines adjacent to a selected bit line during an access operation to the memory.

19 Claims, 5 Drawing Sheets

MEMORY DEVICE

BACKGROUND OF THE INVENTION

1. Field of the Invention

The present invention relates to the data storage field; more specifically, the present invention relates to a non-volatile semiconductor memory device.

2. Description of the Related Art

Non-volatile memory devices are commonly used to store information which must be preserved also in absence of an electric power source that supply the memory device. A particular class of non-volatile memory devices is electrically programmable, like flash E²PROM. Typically, the memory device includes a matrix of memory cells, for example arranged in rows and columns. Each memory cell consists of a floating gate MOS transistor programmed by injecting an electric charge into its floating gate; on the contrary, the transistor is erased by removing the electric charge from its floating gate. The electric charge in the floating gate modifies the threshold voltage of the transistor, in such a way as to define different logic values.

The memory device further includes a bit line for each column of the matrix, and a word line for each matrix row. A typical matrix architecture is the so-called NOR architecture, according to which the generic cell is positioned at the crossing of the bit line and the word line corresponding to the column and row that the cell belongs to, and all the cells of a same column are connected, in parallel to each other and by their drain terminal, to a same bit line.

A read operation of the memory cells provides for biasing them in prescribed read operating conditions, and detecting the current that the memory cells sink. Particularly, during a reading phase of flash memory cells, it is necessary to bias the addressed bit lines, to which the cells belong, at a reading voltage $V_{pr}$, typically 1V.

The bit lines are conductive lines photolithographically obtained from, e.g., a metal layer. The unavoidable capacitive coupling between selected bit lines (access bit lines) and bit lines adjacent thereto (side bit lines) causes the generation of a current noise signal on the selected bit lines. This capacitive coupling is due to the fact that, owing to the ultra-large scale of integration, the distance (pitch) between adjacent bit lines in modern memory devices becomes smaller and smaller. Said current noise signal adds up to the reading current of the selected cell during its read operation. During the selected bit line charging (from a starting voltage substantially equal to the ground voltage to the reading voltage $V_{pr}$), the adjacent bit lines are capacitively brought towards a voltage value equal to a fraction of the voltage $V_{pr}$. Then, the side bit lines discharge in a way that depends on the programming state of the memory cells adjacent to the accessed memory cell (that is, the memory cells belonging to the same word line as the selected cell, and to the bit lines adjacent to the accessed bit line). In fact, if both of the immediately adjacent cells are programmed (high threshold voltage), and thus do not conduct current, the side bit lines do not discharge and remain at the voltage value reached during the charging phase. On the contrary, if one of the adjacent cells is not programmed (low threshold voltage), thereby conducting current, the bit line corresponding to the unprogrammed cell discharges toward ground. In short, both, only one, or none of the side bit lines may discharge toward ground, depending on the state of the adjacent memory cells. Consequently, during the reading phase of a memory cell, a noise current $I_n$ is superimposed on the cell current $I_r$, and this noise current $I_n$ depends on the adjacent memory cells state, so its value can not be forecasted in the design phase. In the case of so-called "multilevel" memory devices, whose memory cells can be programmed in more than two states, the current sunk by each memory cell has more than two possible values, so the noise current is even more variable.

The total current ($I=I_r+I_n$) the sense amplifier receives at its input might determine the detection of a value different from the one actually stored in the accessed cell.

This problem of bit line capacitive coupling, also referred to as the "fringing" effect problem, results particularly critical when the current difference between different logic values that the cell reading current $I_r$ may take, depending on the logic value stored therein, is small, as for example in the case of multilevel memory devices.

In view of the state of the art outlined in the foregoing, the Applicant has faced the problem of how to avoid or at least reduce the problem of reading errors caused by fringing effects on the bit lines.

BRIEF SUMMARY OF THE INVENTION

According to one embodiment of the present invention, a semiconductor memory device is provided. The semiconductor memory device includes a plurality of memory cells, arranged according to a plurality of rows and a plurality of column. The memory devices further includes a plurality of bit lines, each bit line being associated with a respective column of said plurality, and a selecting structure of the bit lines, to select at least one among said bit lines, keeping the remaining bit lines unselected. The memory device further includes a voltage clamping circuit, adapted to causing the clamping at a prescribed voltage of the unselected bit lines adjacent to a selected bit line during an access operation to the memory.

BRIEF DESCRIPTION OF THE SEVERAL VIEWS OF THE DRAWINGS

Further features and advantages of the present invention will be made clear by the following description of a preferred embodiment thereof, given purely by way of a non-restrictive indication, with reference to the attached drawings, wherein.

DETAILED DESCRIPTION OF THE INVENTION

Figure 1:
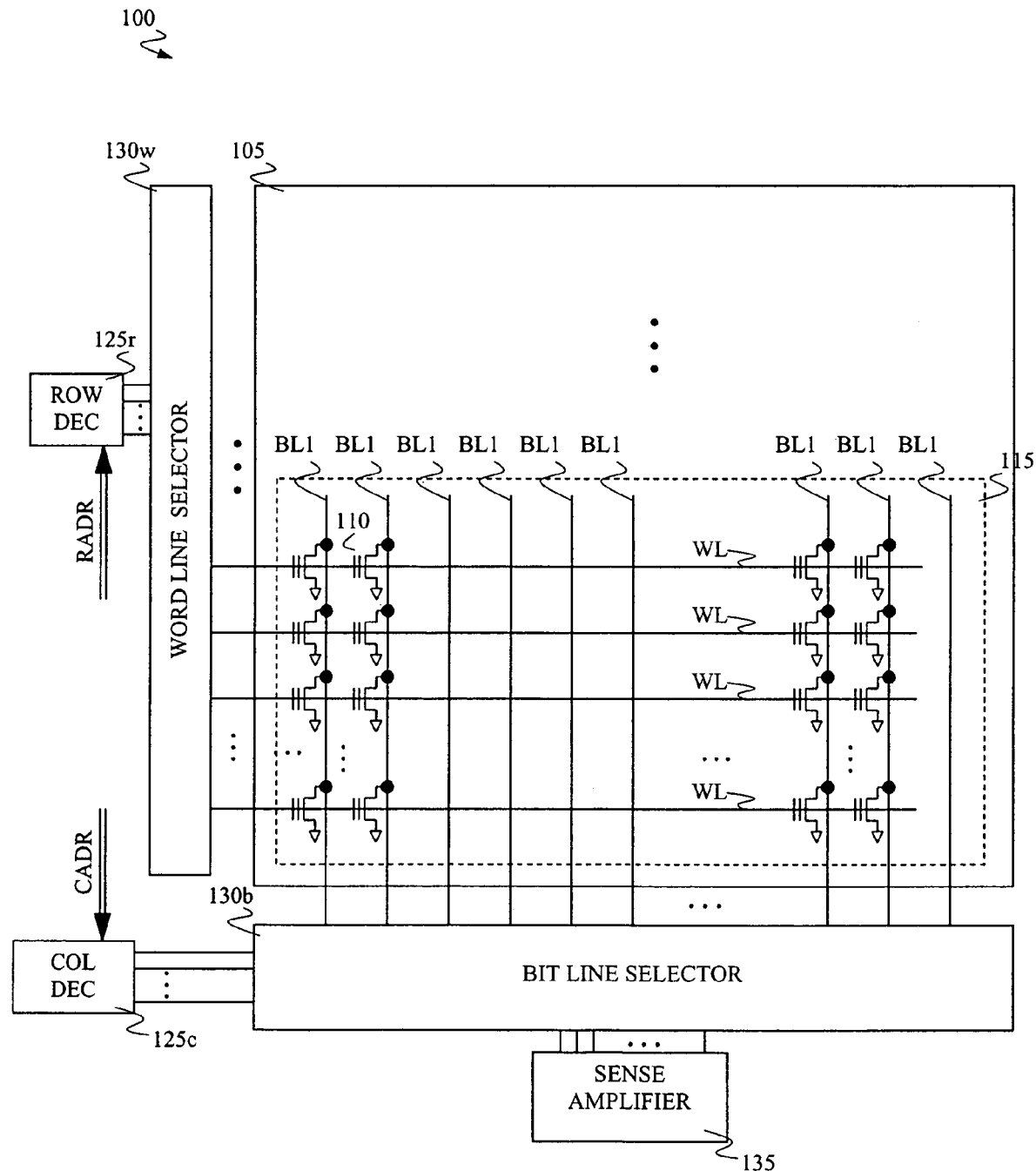
FIG. 1 schematically shows a memory device in which the present invention can be applied.

With reference to the drawings, in FIG. 1 a non-volatile memory device 100, for example a flash E²PROM, is illustrated. The flash memory 100 is integrated in a chip of semiconductor material, and includes a matrix 105 of memory cells 110; typically, each cell 110 includes a floating gate NMOS transistor. In an erased condition, the cell 110 has a low threshold voltage value (conventionally associated with a "1" logic value). The cell 110 is programmed by injecting electric charges into its floating gate; in the programmed condition, the cell 110 has a high threshold voltage value (conventionally associated with a "0" logic value). Therefore, when a selected cell 110 is biased for reading, the cell 110 is conductive if erased or non-conductive if programmed. In the case of a multilevel flash memory, the electric charge in the floating gate modifies the threshold voltage of the transistor in such a way as to define different logic values, and therefore different conductivity states. For example, in a four-level memory device, the generic memory cell can take one of four different threshold voltage values (associated with the "00", "01", "10" and "11" logic values).

The matrix 105 is for example organized in a plurality of memory sectors 115.

The cells 110 of the generic memory sector are organized in a plurality of rows (for example, 2048) and a plurality of columns (for example, 4096). To each row there is associated a respective word line WL, while to each column there is associated a respective bit line BL.

The flash memory 100 has a so-called NOR architecture, in which memory cells of a same column are all connected by their drains in parallel to the bit line corresponding to said column.

The row selection is carried out by means of a row decoder 125*r* receiving a row address RADR, decoding it and selecting a corresponding row. Particularly, the row decoder 125*r* causes a word line selector 130*w* to bias the word line WL corresponding to the selected memory cell(s) 110 to a high voltage value (for example, to a value corresponding to a supply voltage $V_{dd}$ of the memory), while the other word lines are driven to a low voltage value (for example, to the value corresponding to ground). The selection of the matrix column is instead carried out by means of a column decoder 125*c*, receiving a column address CADR and selecting corresponding bit lines BL1 (typically, eight or sixteen bit lines, depending on the memory parallelism) by means of a bit line selector 130*b*, which structure will be analyzed later on. In short, the bit line BL1 corresponding to the addressed memory cell 110 is selected and connected to a sense amplifier 135 by the bit line selector 130*b*. The other bit lines BL1 (that do not correspond to the addressed memory cell 110) are instead kept isolated from the sense amplifier 135. The sense amplifier 135 receives memory cell current values corresponding to the state of the selected memory cell 110, and provides an amplified full-logic version thereof, made available at memory output terminals (not shown in FIG. 1).

Similar considerations apply if the matrix, and/or the sectors have different sizes, or if the memory cells are implemented with other components. The concepts of the present invention are also applicable when the matrix rows and columns are merely topological definitions, and can be implemented with any other geometrical alignments.

Figure 2:
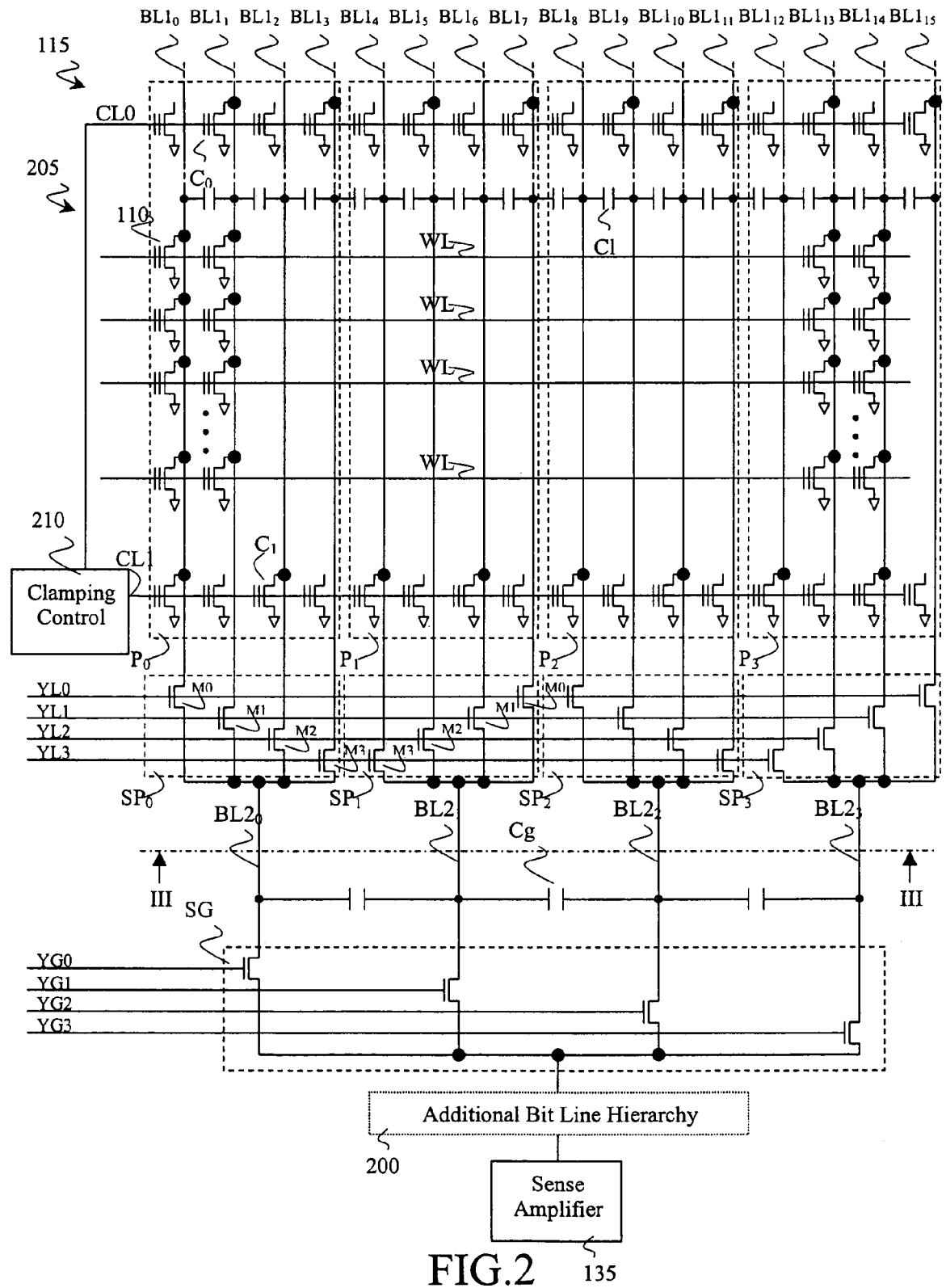
FIG. 2 illustrates schematically the structure of a portion of a memory sector of the memory device of FIG. 1, according to an embodiment of the present invention.
Figure 3:
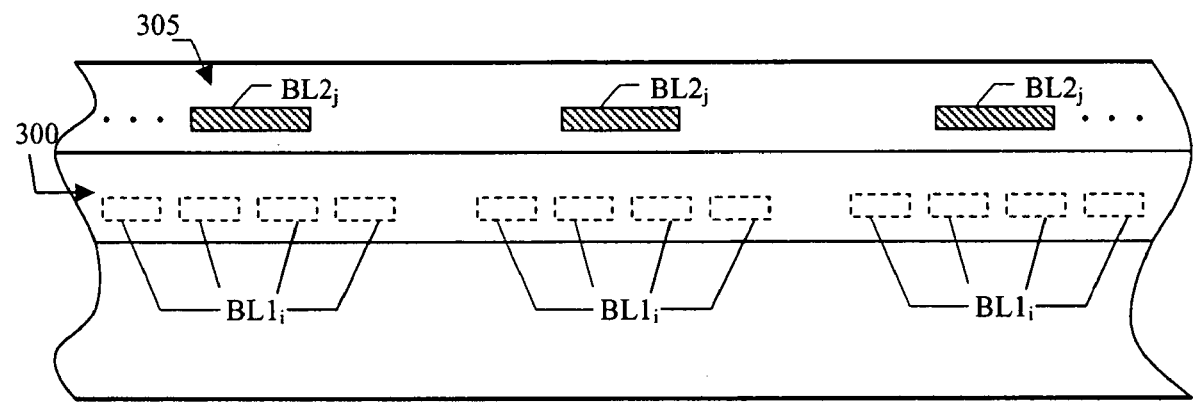
FIG. 3 illustrates very schematically a cross sectional view along line III—III of FIG. 2.

Considering now FIGS. 2 and 3, an example of the structure of a portion of the generic memory sector 115 is illustrated, according to an embodiment of the present invention (the elements corresponding to those shown in FIG. 1 are denoted with the same reference numerals, and their explanation is omitted for the sake of brevity).

More particularly, FIG. 3, is a very simplified cross-sectional view of the structure shown in the FIG. 2, along the line III—III. In this section, only some elements of the complete structure are represented.

According to a solution known in the art, the column selection is done in more levels, according to a hierarchical bit line architecture, having two or more hierarchical levels. The bit lines are arranged in first-level (or local) bit lines, and second-level bit lines. The first-level bit lines are for example formed photolithographically from a first metal layer, whereas the second-level bit lines are formed photolithographically from a second metal layer. Additional hierarchical levels of bit lines can be provided.

According to the example herein considered, in FIG. 2 a plurality (sixteen) of local bit lines $BL1_i$ (i=0 to 15) is illustrated, the local bit lines consisting of lines photolithographically realized from a first layer of metal 300, as shown in FIG. 3A. The local bit lines $BL1_i$ can be ideally grouped into two different sets. The local bit lines $BL1_i$ belonging to the first set are identified by an index "i" which takes even values (i.e., 0, 2, . . . ), while the local bit lines $BL1_i$ belonging to the second set are identified by an index "i" which takes odd values (i.e., 1, 3, . . . ). The local bit lines $BL1_i$ are also grouped together in packets $P_j$ (j=0 to 3) of, in the example, four bit lines $BL1_i$ each.

The generic local bit line $BL1_i$ belonging to the generic packet $P_j$ is selected among the other local bit lines BL1*i* belonging to the same packet $P_j$ by means of a local selector circuit $SP_j$, corresponding to that packet $P_j$. The local selector circuits $SP_j$ are each one connected to four command lines. Said command lines (the same for all the local selector circuits $SP_j$ belonging to the sector 115) are driven by the column decoder 125*c* and carry four local decoding signals YL0, YL1, YL2, YL3 provided.

The generic local selector circuit $SP_j$ comprises individual selectors, e.g., pass-transistors M0, M1, M2, M3, for each of the local bit lines $BL1_i$ of the packet, and each of said pass-transistor is controlled by a respective one of the local decoding signals YL0, YL1, YL2, YL3.

Each packet $P_j$ comprising four local bit lines $BL1_i$ is associated with a corresponding global bit line BL2*j* (according to this example, j=0 to 3), belonging to the second bit line hierarchical level, and, referring to FIG. 3A, consisting of a line photolithographically realized from a second layer 305 of metal. Each global bit line BL2*j* is common to more sectors 115, and is selected among the other global bit lines BL2*j* by means of a global selector circuit SG, connected to four command lines. Said command lines are driven by the column decoder 125*c* and carry four global decoding signals YG0, YG1, YG2, YG3.

In a typical memory, eight or even sixteen groups of four packets $P_j$ may be provided for.

In FIG. 2 there is also shown a circuit block 200 schematically representing possible higher bit line hierarchical levels, whose presence is however not limitative to the present invention.

Fringing field effects between adjacent bit lines exist, as explained in the introduction, which cause capacitive couplings between adjacent bit lines. When a hierarchical bit line architecture is employed, as in the example herein discussed, the fringing effect takes place both at the local bit lines level, and at the level of the global bit lines.

In FIG. 2, the capacitive coupling between adjacent local bit lines $BL1_i$ is illustrated by means of "local" fringing capacitances Cl, for simplicity represented as lumped circuit elements; the capacitive coupling between adjacent global bit lines BL2 is represented by means of "global" fringing capacitances Cg. As explained in the introductory part of this description, these capacitive couplings may cause errors during the reading phase.

To solve the problem, according to an embodiment of the invention, a voltage clamping circuit 205 is provided, for holding to ground the ("side") bit lines adjacent to a selected bit line. According to an embodiment of the present invention, the voltage clamping circuit 205 includes MOS transistors $C_0$, $C_1$ having a structure identical to the memory cells, but, differently from the memory cells, these transistors $C_0$, $C_1$ (also called "clamping cells") are not available to the user for storing information. The clamping cells are in particular connected to two dedicated clamping control lines CL0, CL1 (similar to the word lines) of the voltage clamping circuit 205, preferably located in peripheral zones of the memory sector. The clamping cells are cells having a properly low threshold voltage value, for example they are unprogrammed cells, adapted to conduct current when activated. These clamping cells are arranged on the bit lines according to two arrays. A first array contains all the clamping cells $C_1$ connected to the local bit lines $BL1_i$ with even "i" index, and a second array contains all the clamping cells $C_0$ connected to the local bit lines $BL1_i$ with odd "i" index. The clamping cells of the first array are for example located just at the bottom of the memory sector, and are driven by the clamping control line CL1; the clamping cells of the second array are for example located at the top of the memory sector, and are driven by the clamping control line CL0. The unused clamping cells (that is, those driven by the clamping control line CL0 but corresponding to an even bit line $BL1_i$, or those driven by the clamping control line CL1 but corresponding to an odd bit line $BL1_i$) are simply lacking of the physical contact with the corresponding local bit line $BL_i$.

The driving of the two clamping control lines CL0, CL1 is managed by a clamping control circuit block 210 (which can be viewed as a part of the column decoder 125*c*), whose operation will be explained later on.

During the reading operation, if the selected cell belongs to an even bit line $BL1_i$ (index "i" even), all the clamping cells $C_0$ corresponding to the odd bit lines are activated, by means of a suitable biasing of the corresponding clamping control line CL0. On the contrary, in the case the selected cell belongs to an odd bit line $BL1_i$ (index "i" odd), the clamping cells C, corresponding to the even bit lines are activated, by properly biasing the clamping control line CL1.

The clamping control circuit block 210 drives the clamping control lines CL0, CL1 in a complementary, mutually opposite manner, with voltage values $V_{high}$ (for example, $V_{high}$ is equal to a power supply voltage of the memory device $V_{dd}$=3.3V) and $V_{low}$ (for example, ground). When for example the clamping control line CL0 is driven to the voltage $V_{high}$ by the clamping control circuit block 210, all the clamping cells belonging to the corresponding array are activated, thus all the local bit lines $BL1_i$ with odd index "i" are grounded. On the contrary, when the clamping control line CL1 is driven to a voltage $V_{high}$ by the clamping control circuit block 210, all the clamping cells belonging to the corresponding array are activated, thus all the local bit lines $BL1_i$ with even index "i" are grounded.

As mentioned previously, the problems due to the fringing effect affects not only the local bit lines, but also the global bit lines $BL2j$ (and the bit lines belonging to the eventual upper hierarchical levels, if present). The exemplary structure shown in FIG. 2 allows avoiding the effects of fringing capacitances at the level of the global bit lines as well.

Referring to FIG. 2, wherein, by the way of example, the packets $P_j$ are formed by four local bit lines $BL1_j$, the individual selector pass-transistors M0, M1, M2, M3 in the local selectors $SP_j$ with even index "j" are arranged in such a way that the decoding of the address necessary to the bit line selection associates the first local bit line $BL1_i$ of the generic packet $P_j$ with the signal YL0, the second bit line with the signal YL1, the third bit line with the signal YL2 and the last bit line with the signal YL3.

On the contrary, the individual selector pass-transistors M0, M1, M2, M3 in the local selectors $SP_j$ with odd index "j" are arranged in such a way that the first local bit line $BL1_i$ of the generic packet $P_j$ is associated with the signal YL3, the second bit line is associated with the signal YL2, the third bit line is associated with the signal YL1 and the last bit line is associated with the signal YL0.

Using this particular decoding "scrambling" (YL0-YL1-YL2-YL3, YL3-YL2-YL1-YL0, YL0-YL1-YL2-YL3 . . . ) it is possible to automatically clamp both the local bit lines $BL1_i$ that are adjacent to the selected local bit line $BL1_i$ belonging to the generic packet $P_j$, and the global bit lines BL2 that are adjacent to the global bit line BL2*j* corresponding to the packet $P_j$. To obtain this result, the clamping control circuit block 210 drives the clamping control lines CL0, CL1 according to the Table 1:

TABLE 1

| CLAMPING CONTROL LINE | YLh | YGj |
|---|---|---|
| CL0 at $V_{high}$ | Even h | Even j |
| CL1 at $V_{low}$ | Odd h | Odd j |
| CL1 at $V_{high}$ | Even h | Odd j |
| CL0 at $V_{low}$ | Odd h | Even j |

Figure 4B:
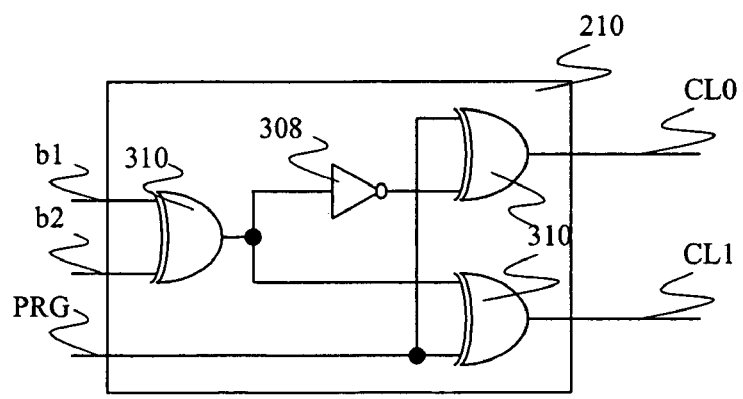
FIG. 4B illustrates a clamping control circuit according to an embodiment of the present invention.
Figure 4A:
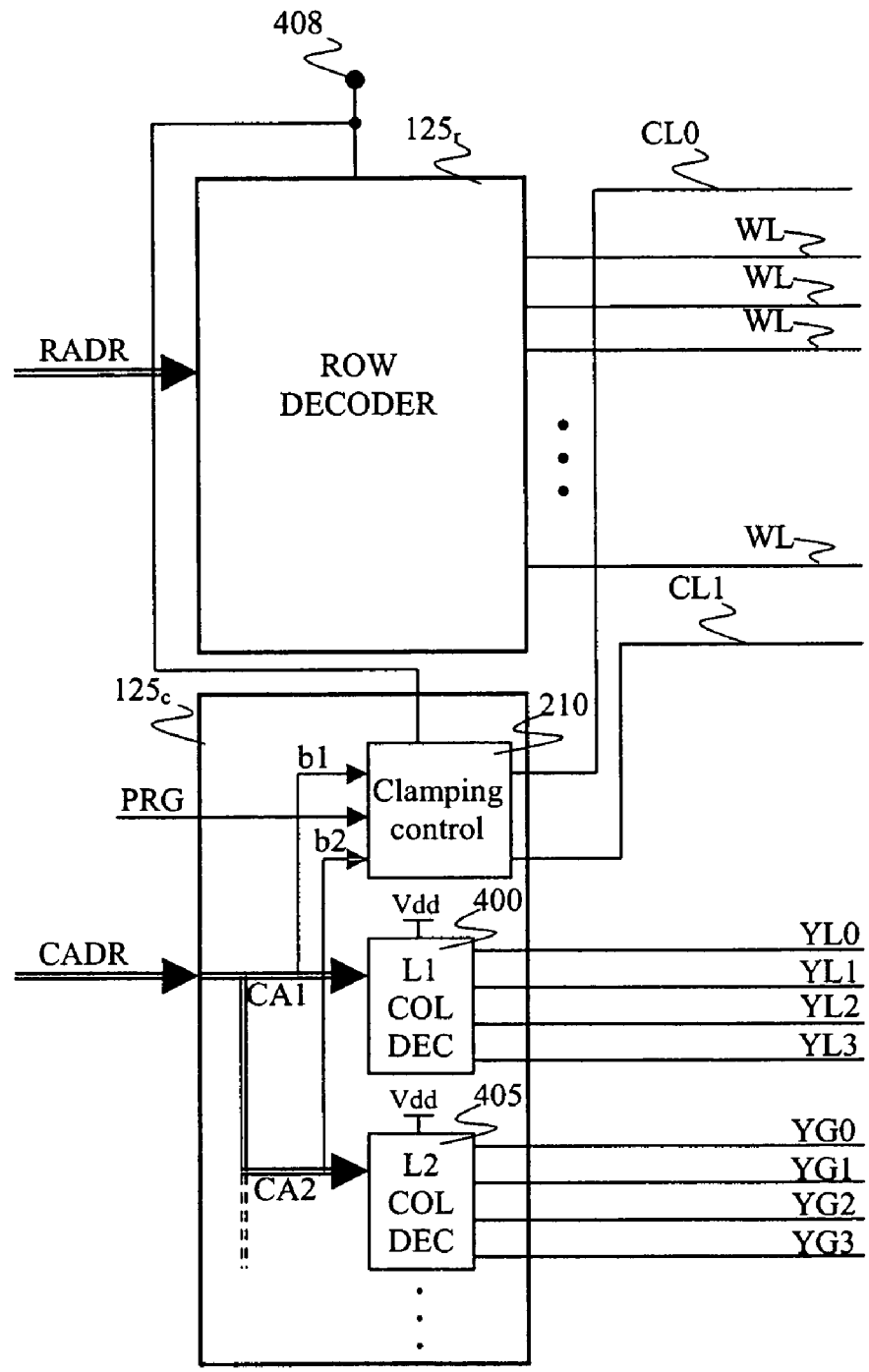
FIG. 4A illustrates a more detailed view of a column decoder of the memory device of FIG. 1, according to an embodiment of the present invention.

Referring now to FIG. 4A, a more detailed scheme of the row decoder 125*r* and the column decoder 125*c* is illustrated, according to an embodiment of the present invention. The elements corresponding to these shown in FIG. 1 or 2 are denoted with the same reference numerals, and their explanation is omitted for the sake of brevity. More particularly, the column address CADR is divided in column address portions CA1, CA2 (the number of different column address portions, and the number of bits each portion is made up depending on the number of the bit line hierarchical levels). This column address portions CA1, CA2 represent the addresses corresponding to each hierarchical level.

According to the particular example represented in FIG. 2, the first (local) level column address portion CA1 is fed to a first-level column decoder 400 (receiving as a supply voltage the memory supply voltage $V_{dd}$), that generates the local decoding signals YL0, YL1, YL2, YL3 corresponding to the column address portion CA1, necessary to drive the local selectors $SP_i$.

Similarly, the second (local) level column address portion CA2 is fed to a second level column decoder 405 (also receiving as a supply voltage the memory supply voltage $V_{dd}$), that generates the global decoding signals YG0, YG1, YG2, YG3 corresponding to the address CA2, necessary to drive the global selector SG.

The clamping control circuit 210 is supplied by a same supply voltage 408 as the row decoder 125*r*. The clamping control circuit 210 receives three digital signals b1, b2 (respectively, the least significant bit of the address portion CA1 and the least significant bit of the address portion CA2) and PRG (whose function will be explained later on) at its input, and properly drives the clamping control lines CL0, CL1 for the proper clamping operations.

Referring now to FIG. 4B, a particular, exemplary and not limitative embodiment of the clamping control circuit 210 is illustrated. Three logic XOR gates 310 and a logic NOT gate 308 accomplish the correct logic function that corresponds to that represented by the Table 1. In fact, when the signal PRG is equal to "0" (normal operation), the clamping lines CL0 and CL1 are driven according to the following equations:

$$CL0 = \overline{b1 \oplus b2}$$

$$CL1 = b1 \oplus b2$$

Similar considerations apply if the column selection includes more than two hierarchic levels.

Figure 5:
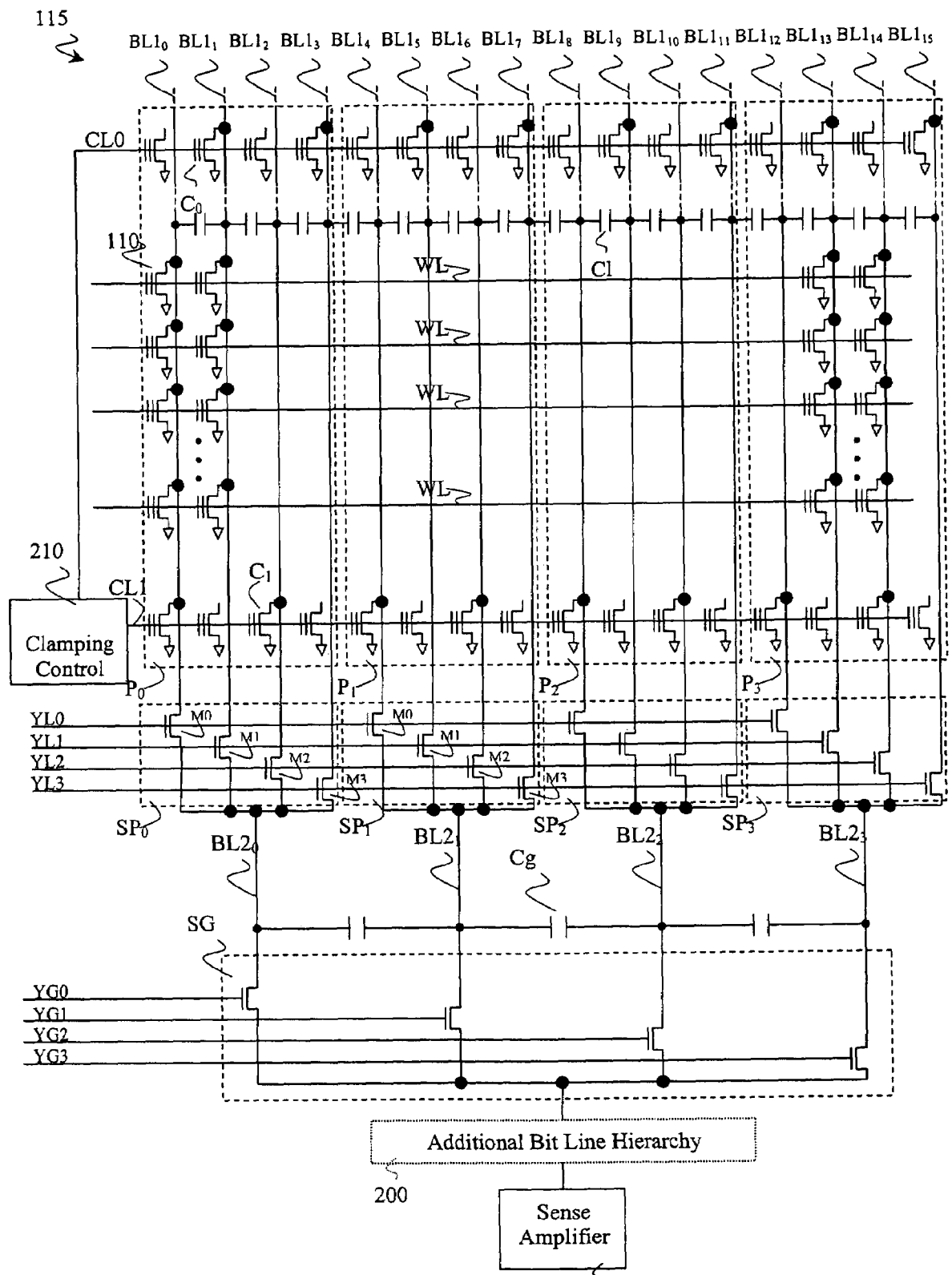
FIG. 5 illustrates by way of comparison a particular portion of a memory sector similar to that of FIG. 2 but organized with a different bit line decoding.

It is observed that if according to a non-preferred embodiment, a different decoding scrambling were adapted (YL0-YL1-YL2-YL3, YL0-YL1-YL2-YL3, YL0-YL1-YL2-YL3 . . . ), as shown in FIG. 5, the global bit lines adjacent to a selected global bit line would not be automatically clamped as a result of the clamping of the local bit lines BL1$_i$. For clamping also the adjacent global bit lines BL2$_j$ it would be necessary to introduce an additional clamping structure.

It is observed that the clamping cells $C_0$ and $C_1$ have an identical structure as the memory cells 110, so the clamping cells may suffer from the typical drawbacks of the others cells (aging, stress, soft programming and the like). For this reason, the presence of the clamping structures preferably involves some specific precautions.

During the reading operation, the clamping control lines CL0 and CL1 are biased to the same reading voltage as the others word lines WL, and are activated immediately at the start of the reading operation. The clamping control lines belonging to the unselected memory sectors 115 remain deactivated. During a normal sequential access reading operation, in which all the memory cells 110 belonging to a given selected bit line BL1 are read in sequence by means of a sequential activation of the word lines WL of the selected sector 115, the clamping control lines CL0 and CL1 of the selected sector 115 remain respectively activated/deactivated in such a way as to minimize their commutations. In the case of a very low-frequency sequential access, the selected clamping control line may instead be deactivated after every single reading, to limit the risks of gate-stress on the clamping cells (however, this gate-stress is far less dangerous compared to the gate-stress on memory cells).

The erasing operation affects the whole memory sector 115, by providing an erasing pulse to all the memory cells 110 belonging to the memory sector 115 selected to be erased. Before applying the erasing pulse, all the memory cells 110 belonging to the memory sector 115 are typically pre-programmed, by means of a pre-programming pulse, so as to bring all the cells in a substantially equal starting condition. After the erasing operation, one can verify, by means of a reading phase ("erase verify"), the logic status of the memory cells 110, to ensure that the memory cells 110 are erased.

The erasing of the whole memory sector 115 also erases the clamping cells $C_0$ and $C_1$. To maintain the same aging as the memory cells 110, and to avoid that the clamping cells became depleted (negative threshold voltage value), one can pre-program the clamping cells $C_0$ and $C_1$ too. In order to program the clamping cells, they are addressed. Normally, the clamping control circuit 210 addresses only the clamping cells ($C_0$ or $C_1$) not belonging to the addressed bit line BL1$_i$. In order to address the clamping cells for programming them, the normal operation logic is reversed by setting the pre-programming signal PRG of FIGS. 4A and 4B to the high logic value. In this way, the clamping lines CL0 and CL1 are driven according to the following equations:

$$CL0 = b1 \oplus b2$$

$$CL1 = \overline{b1 \oplus b2}$$

During the erase verify phase, the clamping cells $C_0$ and $C_1$ may be verified, so as to check the current driving capability thereof.

During a programming phase of normal memory cells 110, the clamping cells $C_0$, $C_1$ are preferably activated. In fact, the capacitive coupling due to the fringing capacitances Cl between adjacent bit lines BL1, in addition to disturbing the memory reading phase, may also cause noise current pulses on the memory cells that are adjacent to the selected cell during the programming phase. However, keeping the clamping control lines deactivated during a programming pulse may be useful to detect the eventually short circuits between bit lines.

Naturally, in order to satisfy local and specific requirements, a person skilled in the art may apply to the solution described above many modifications and alterations all of which, however, are included within the scope of protection of the invention as defined by the following claims.

The invention claimed is:

1. A semiconductor memory device, comprising:
    a plurality of memory cells, arranged according to a plurality of rows and a plurality of columns;
    a plurality of bit lines, each bit line being associated with a respective column of said plurality;
    a selecting structure of the bit lines, for selecting at least one of said bit lines, keeping unselected plural bit lines adjacent to the selected at least one of said bit lines;
    a voltage clamping circuit structured to cause clamping at a prescribed voltage of at least one of the unselected bit lines adjacent to the selected at least one of said bit lines during an access operation to the memory.

2. The memory device of claim 1, wherein said voltage clamping circuit includes:
    a plurality of controlled clamping devices, each one univocally connected to a respective bit line;
    a control structure for controlling the controlled clamping devices, by selective activation thereof.

3. The memory device of claim 2, wherein:
    the bit lines are grouped in at least first and second groups, the bit lines belonging to the first group being alternated with the bit lines belonging to the second group;
    said plurality of controlled clamping devices is arranged according to at least two arrays, the bit lines belonging to the first group being connected to the controlled clamping devices belonging to the first array, and the bit lines belonging to the second group being connected to the controlled clamping devices belonging to the second array.

4. The memory device of claim 3, wherein the control structure for the controlled clamping devices is structured to activate the controlled clamping devices belonging to the first array when the selecting structure of the bit lines selects a bit line belonging to the second group, and vice versa.

5. The memory device of claim 4, wherein the bit lines selecting structure comprises a hierarchic column selecting structure, comprising:
    a first hierarchic level comprising said bit lines;
    a hierarchy of levels higher than the first hierarchic level, said levels hierarchy comprising at least a level higher than the first hierarchic level, said level higher than the first hierarchic level comprising respective higher level bit lines each one associated with a respective packet of bit lines belonging to the lower hierarchic level, said packets of bit lines being grouped in at least a first and a second collections of packets, the packets belonging to the first collection being alternated with the packets belonging to the second collection; and a plurality of selecting signals that are activated in a mutually exclusive manner, said plurality of selecting signals including a number of selecting signals equal to the number of bit lines belonging to the packet;

for each packet of bit lines, a respective plurality of selectors, each selector being associated with a respective bit line and being controlled by a respective selecting signal of said plurality, in such a way that the activation of one of said selecting signals determines the selection of a respective bit line of the packet;

a correlation between the selecting signals and bit lines being such that each selecting signal is associated with bit lines belonging to the first group in packets belonging to the first collection, and with bit lines belonging to the second group in packets belonging to the second collection, or with bit lines belonging to the second group in packets belonging to the first collection and with bit lines belonging to the first group in packets belonging to the second collection.

6. The memory device of claim 5, wherein the bit lines belonging to the first hierarchic level are formed from a first conductive layer, and the bit lines belonging to the level higher than the first are formed from a second conductive layer.

7. The memory device of claim 1, wherein the voltage clamping circuit includes controlled clamping devices implemented with dedicated memory cells that are not available for storing information, each controlled clamping device being connected to a respective one of the bit lines.

8. The memory device of claim 7, in which said dedicated memory cells are arranged in a first and a second alignments each comprising a number of dedicated memory cells equal to the number of bit lines, the dedicated memory cells belonging to the first alignment being provided with an electric contact to respective bit lines of a first group of the plurality of bit lines, and the dedicated memory cells belonging to the second alignment being provided with an electric contact to respective bit lines of a second group of the plurality of bit lines.

9. In a semiconductor memory device that includes a plurality of memory cells, arranged in a plurality of rows and a plurality of columns, and a plurality of bit lines each associated with a respective column of said plurality, a method comprising:

selecting one of the bit lines; and clamping at a prescribed voltage unselected bit lines adjacent to the selected bit line during a memory access operation.

10. The method of claim 9, wherein the bit lines are grouped in at least first and second groups, the bit lines belonging to the first group being alternated with the bit lines belonging to the second group, the method including clamping the bit lines belonging to the group not containing the selected bit line.

11. The method of claim 10, wherein the memory device includes a hierarchic column selecting structure comprising:

a first hierarchic level comprising said bit lines;

a levels hierarchy of levels higher than the first, said hierarchy comprising at least a level higher than the first, said level higher than the first comprising respective bit lines each associated to a respective packet of bit lines belonging to the lower hierarchic level, said packets of bit lines being grouped in a first and a second collection of packets, the packets belonging to the first collection being alternated to the packets belonging to the second collection, the method further including:

clamping bit lines belonging to packets adjacent to the packet containing the selected bit line, wherein said bit lines in the adjacent packets result connected to the corresponding higher-level bit line as a result of the selection of the selected bit line, so as to automatically clamp the bit lines belonging to the level higher than the first adjacent to the bit line belonging to the level higher than the first corresponding to the packet which contains the selected bit line.

12. A semiconductor memory device, comprising:

a plurality of memory cells arranged according to a plurality of rows and a plurality of columns;

a plurality of bit lines, each bit line being associated with a respective column of the plurality;

a bit line selector structured to select one of the bit lines;

a plurality of clamping memory cells each coupled between a respective one of the bit lines and a reference voltage; and a clamping controller structured to activate plural of the clamping memory cells that are coupled to non-selected bit lines adjacent to the selected bit line, thereby connecting the non-selected bit lines to the reference voltage.

13. The memory device of claim 12, wherein:

the bit lines are grouped in at least first and second groups, the bit lines belonging to the first group being alternated with the bit lines belonging to the second group;

the plurality of clamping memory cells is arranged according to at least two arrays, the bit lines belonging to the first group being connected to the clamping memory cells belonging to the first array, and the bit lines belonging to the second group being connected to the clamping memory cells belonging to the second array.

14. The memory device of claim 13, wherein the clamping controller is structured to activate the clamping memory cells belonging to the first array when the selected bit line belongs to the second group.

15. The memory device of claim 12, wherein the bit line selector includes a hierarchic column selecting structure comprising:

a first hierarchic level comprising the plurality of bit lines;

a hierarchy of levels higher than the first hierarchic level, the levels hierarchy comprising a level higher than the first hierarchic level, the level higher than the first hierarchic level comprising respective higher level bit lines each one associated with a respective packet of bit lines belonging to the lower hierarchic level;

for each packet of bit lines, a respective plurality of selectors, each selector being coupled between a respective one of the bit lines and one of the higher level bit lines and having a control terminal; and a plurality of selecting signals that are activated in a mutually exclusive manner, each selection signal being coupled to the control terminal of a respective one of the selectors for each packet of bit lines.

16. The memory device of claim 15, wherein:

the bit lines are grouped in at least first and second groups, the bit lines belonging to the first group being alternated with the bit lines belonging to the second group;

the plurality of clamping memory cells is arranged according to at least two arrays, the bit lines belonging to the first group being connected to the clamping memory cells belonging to the first array, and the bit lines belonging to the second group being connected to the clamping memory cells belonging to the second array.

17. The memory device of claim 16 wherein:

the packets of bit lines are grouped in at least a first and a second collections of packets, the packets belonging to the first collection being alternated with the packets belonging to the second collection;

a first one of the selection signals controls selectors that are coupled to bit lines belonging to the first collection of packets and the first group and bit lines belonging to the second collection of packets and the second group; and a second one of the selection signals controls selectors that are coupled to bit lines belonging to the first collection of packets and second first group and bit lines belonging to the second collection of packets and the first group.

18. The memory device of claim 15, wherein the bit lines belonging to the first hierarchic level are formed from a first conductive layer, and the bit lines belonging to the level higher than the first are formed from a second conductive layer.

19. The memory device of claim 12, wherein the clamping memory cells are arranged in a first and a second alignments each comprising a number of clamping memory cells equal to the number of bit lines, the clamping memory cells belonging to the first alignment being provided with an electric contact to respective bit lines of a first group of the plurality of bit lines, and the clamping memory cells belonging to the second alignment being provided with an electric contact to respective bit lines of a second group of the plurality of bit lines.

* * * * *